US007169659B2

(12) United States Patent
Rotondaro et al.

(10) Patent No.: US 7,169,659 B2
(45) Date of Patent: Jan. 30, 2007

(54) METHOD TO SELECTIVELY RECESS ETCH REGIONS ON A WAFER SURFACE USING CAPOLY AS A MASK

(75) Inventors: Antonio L. P. Rotondaro, Dallas, TX (US); Seetharaman Sridhar, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 121 days.

(21) Appl. No.: 10/931,195

(22) Filed: Aug. 31, 2004

(65) Prior Publication Data

US 2006/0046367 A1    Mar. 2, 2006

(51) Int. Cl.
*H01L 21/8238* (2006.01)
(52) U.S. Cl. .............. 438/199; 438/275; 438/300; 257/369; 257/382
(58) Field of Classification Search .............. 438/199
See application file for complete search history.

(56) References Cited

U.S. PATENT DOCUMENTS

| 6,303,486 | B1 | 10/2001 | Park |
| 6,368,967 | B1 | 4/2002 | Besser |
| 6,906,393 | B2* | 6/2005 | Sayama et al. ............. 257/414 |
| 2004/0262694 | A1 | 12/2004 | Chidambaram |
| 2005/0029601 | A1* | 2/2005 | Chen et al. ................. 257/369 |
| 2005/0139872 | A1 | 6/2005 | Chidambaram et al. |

* cited by examiner

*Primary Examiner*—Carl Whitehead, Jr.
*Assistant Examiner*—Colleen E. Rodgers
(74) *Attorney, Agent, or Firm*—Peter K. McLarty; W. James Brady, III; Frederick J. Telecky, Jr.

(57) ABSTRACT

The present invention facilitates semiconductor fabrication by providing methods of fabrication that selectively apply strain to channel regions of devices while mitigating masking operations employed. A CAPOLY layer is formed over an NMOS region of a semiconductor device (102). A recess etch is performed on active regions of devices within a PMOS region of the semiconductor device (104) and the CAPOLY layer prevents etching of devices within an NMOS region of the semiconductor device. Subsequently, an epitaxial formation process (106) is performed that forms or deposits epitaxial regions and introduces a first type of strain across the channel regions in the PMOS region. Then, the semiconductor device is annealed (108) to cause the CAPOLY layer to introduce a second type of strain across the channel regions in the NMOS region. After annealing, the CAPOLY layer is removed (110).

21 Claims, 8 Drawing Sheets

METHOD TO SELECTIVELY RECESS ETCH REGIONS ON A WAFER SURFACE USING CAPOLY AS A MASK

FIELD OF INVENTION

The present invention relates generally to semiconductor devices and more particularly to transistors and associated methods of manufacture having improved mobility due to channel strain.

BACKGROUND OF THE INVENTION

A conventional MOS transistor generally includes a semiconductor substrate, such as silicon, having a source, a drain, and a channel positioned between the source and drain. A gate stack composed of a conductive material (a gate conductor), an oxide layer (a gate oxide), and sidewall spacers, is typically located above the channel. The gate oxide is typically located directly above the channel, while the gate conductor, generally comprised of polycrystalline silicon (polysilicon) material, is located above the gate oxide. The sidewall spacers protect the sidewalls of the gate conductor.

Generally, for a given electric field across the channel of a MOS transistor, the amount of current that flows through the channel is directly proportional to a mobility of carriers in the channel. Thus the higher the mobility of the carriers in the channel, the more current can flow and the faster a circuit can perform when using high mobility MOS transistors. One mechanism to increase the mobility of the carriers in the channel of an MOS transistor is to produce a mechanical stress or strain in the channel.

A compressive strained channel typically provides hole mobility enhancement, which is particularly beneficial for PMOS devices, whereas a tensile strained channel typically provides electron mobility enhancement, which is particularly beneficial for NMOS devices. An exemplary method of introducing tensile strain in a channel region is to cover transistor devices with a CAP layer comprised of a selected material that, when annealed, generates the tensile strain in the channel regions. An exemplary method of introducing compressive strain in a channel region is to remove a selected amount of material from a surface portion of active regions and subsequently re-depositing a material that generates the appropriate strain.

However, the compressive strain that improves hole mobility can degrade electron mobility and the tensile strain that improves electron mobility can also degrade hole mobility. As a result, introducing tensile strain, such as by using a CAP layer, can improve performance of NMOS devices but degrade performance of PMOS devices. Additionally, introducing compressive strain, such as by recessing and filling with a suitable material, can improve performance of PMOS devices but degrade performance of NMOS devices.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention facilitates semiconductor fabrication by separately applying stress to channel regions of PMOS and NMOS devices. As a result, channel mobility for both PMOS and NMOS devices can be improved without resulting in channel mobility degradation to each other.

The present invention employs a CAPOLY layer that selectively covers an NMOS region containing NMOS devices. The CAPOLY layer serves as a mask that permits selectively applying a type of stress, typically compressive stress, to channel regions of PMOS devices within a PMOS region instead of employing additional masks as is conventionally done. Subsequently, the CAPOLY layer is employed to selectively apply a type of stress, typically tensile stress, to channel regions of NMOS devices within an NMOS region.

According to one aspect of the invention, a CAPOLY layer is formed over an NMOS region of a semiconductor device. A recess etch is performed on active regions of devices within a PMOS region of the semiconductor device wherein the CAPOLY layer prevents etching of devices within an NMOS region of the semiconductor device. Subsequently, an epitaxial layer is formed that introduces a first type of strain across the channel regions in the PMOS region. Subsequently, the semiconductor device is annealed, which causes the CAPOLY layer to introduce a second type of strain across the channel regions in the NMOS region.

The following description and annexed drawings set forth in detail certain illustrative aspects and implementations of the invention. These are indicative of but a few of the various ways in which the principles of the invention may be employed.

DETAILED DESCRIPTION OF THE INVENTION

Figure 1:
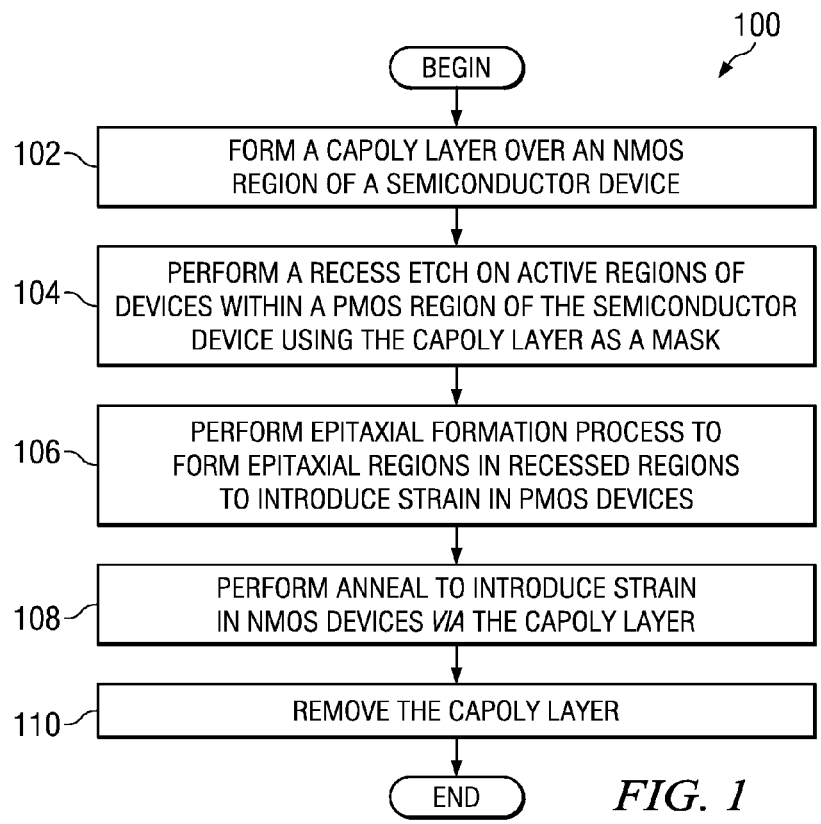
FIG. 1 is a flow diagram illustrating a method of fabricating a semiconductor device that selectively introduces strain into channel regions of transistor devices located within NMOS and PMOS regions of a semiconductor device in accordance with an aspect of the present invention.

One or more implementations of the present invention will now be described with reference to the attached drawings, wherein like reference numerals are used to refer to like elements throughout, and wherein the illustrated structures are not necessarily drawn to scale. The invention provides transistor structures and methods in which transistor mobility is improved while reducing masks employed in fabrication thereof.

FIG. 1 is a flow diagram illustrating a method 100 of fabricating a semiconductor device that selectively introduces strain into channel regions of transistor devices located within NMOS and PMOS regions of a semiconductor device in accordance with an aspect of the present invention.

The method 100 begins at block 102 wherein a CAPOLY layer, also referred to as a stacked poly cap, is formed over an NMOS region of the semiconductor device. The CAPOLY layer is formed by depositing and/or growing one or more layers of materials (e.g., oxide, nitride, and the like) that can operate as a mask during recess etching and also introduce a desired type of strain in the NMOS region of the device when annealed. Generally, the CAPOLY layer is formed over active regions and gate electrodes of transistor devices in both the NMOS region and a PMOS region of the semiconductor device. Subsequently, a portion of the CAPOLY layer is removed from the PMOS region. A suitable CAPOLY layer is comprised of a lower insulative layer (e.g., oxide) and a middle layer formed on the lower layer comprised of a suitable material and thickness that introduces a desired amount of strain (e.g., nitride). A thin, top layer (e.g., oxide) is generally formed on the middle layer to facilitate patterning.

Continuing at block 104, a recess etch is performed on active regions, also referred to as source/drain regions, of transistor devices in the PMOS region of the semiconductor device, wherein the CAPOLY layer prevents or mitigates etching of channel regions in the NMOS region. The recess etch removes an amount of material from surfaces of the active regions thereby forming recessed regions.

Subsequently, an epitaxial growth or formation process is performed to form epitaxial regions in the active regions of the transistor devices in the PMOS region and refill the recessed regions at block 106. The epitaxial regions can be doped with a suitable dopant, such as boron, during formation or by a subsequent implantation process. The formation process and resulting epitaxial regions introduce a first type of strain (e.g., uniaxial compressive strain and biaxial compressive strain) across the channel regions of the transistor devices in the PMOS region.

A thickness of the recessed regions and the epitaxial regions are factors in the amount of the first type of strain introduced across the channel regions of transistor devices within the PMOS region. Additionally, the composition of the epitaxial regions (e.g., silicon-germanium, and carbon doped silicon) is an additional factor in the amount of the first type of strain introduced across the channel regions of transistor devices within the PMOS region.

An anneal process is performed at block 108 that causes the CAPOLY layer to introduce a second type of strain (e.g., uniaxial tensile strain or biaxial tensile strain) across channel regions of transistor devices within the NMOS region. The anneal process performed is typically a spike anneal that occurs for a relatively short time at a high temperature (e.g., less than a second at temperature in the range of 1000° C. to 1100° C., preferably at 1050° C.). A thickness and/or composition of the CAPOLY layer determines the amount of the second type of strain introduced into the channel regions of the NMOS region. The time and temperature of the anneal process can be selected to further select or adjust the amount of strain introduced. For instance, ultra high temperature annealing at 1300° C. for a duration on milliseconds can be used to increase stress.

Subsequently, the CAPOLY layer is removed at block 110, which allows additional fabrication procedures, such as silicidation and metallization, to be performed. One suitable mechanism to remove the CAPOLY layer is to employ a plasma dry etch selective to an underlying layer to remove the CAPOLY layer. For example, for a CAPOLY comprising an oxide covered by a nitride, a two-step etch process may be employed, wherein the first etch is selective to the oxide and the second etch is selective to the underlying layer.

Figure 2:
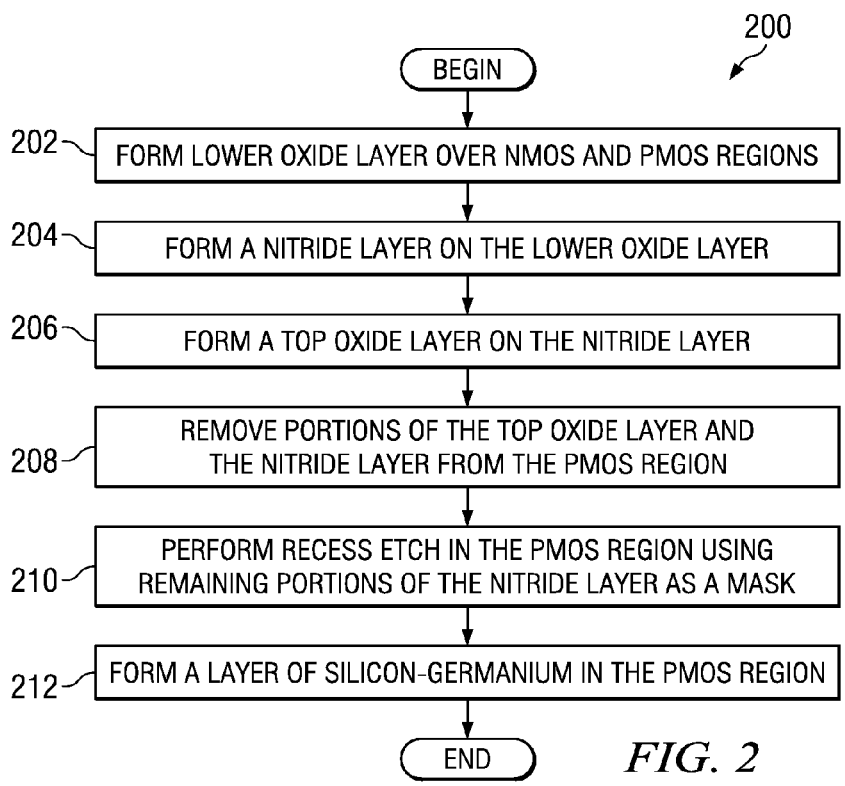
FIG. 2 is a flow diagram illustrating a method of fabricating and employing a CAPOLY layer in fabricating a semiconductor device in accordance with an aspect of the present invention.

Turning now to FIG. 2, a flow diagram illustrating a method 200 of fabricating and employing a CAPOLY layer in fabricating a semiconductor device in accordance with an aspect of the present invention is described. The method 200 forms the CAPOLY layer comprising a lower oxide layer, a nitride layer, and a top oxide layer. The CAPOLY layer can be employed as a mask for selective recess etching and also for selectively introducing tensile strain. Additionally, the CAPOLY layer formed in this method 200 can also be employed in the method 100 of FIG. 1, as described above.

The method 200 begins at block 202 wherein a lower oxide layer is formed over NMOS and PMOS regions of the semiconductor device. The lower oxide layer is grown or deposited (e.g., via CVD) and can later serve as an etch stop layer. A nitride layer is formed on the lower oxide layer at block 204. The nitride layer is formed to a suitable thickness that correlates to a desired amount of strain to induce later in the NMOS region. A top oxide layer is then formed (e.g., via CVD) on the nitride layer at block 206 and serves to facilitate patterning of the CAPOLY layer. It is appreciated that the top oxide layer can be absent in alternate aspects of the present invention.

A portion of the top oxide layer and the nitride layer is removed from the PMOS region of the semiconductor device at block 208. Typically, a dry etch plasma process selective to oxide is employed to remove the nitride layer. The top oxide layer is also removed by the dry etch plasma process because it is relatively thin.

A recess etch is performed on active regions of the PMOS region using remaining portions of the nitride layer as a mask that prevents etching of the NMOS region at block 210. The recess etch removes the lower oxide layer from the PMOS region and removes an amount of silicon material from surfaces of active regions within the PMOS region. The amount of material removed from the surfaces of the active regions is referred to as a recess amount and defines a recessed region. Generally, the recess etch also removes the top oxide layer from the NMOS region but does not substantially remove material from remaining portions of the nitride layer because the recess etch is selective to nitride.

An epitaxial growth process is performed at block 212 by growing a layer of silicon-germanium within and over the recessed regions. The silicon-germanium can be suitably doped during formation and/or after formation by a subsequent implantation and introduces compressive strain to channel regions of transistor devices within the PMOS region. The amount of compressive strain introduced is related to the thickness and composition of the grown silicon-germanium. Additional processes can also be performed including annealing to introduce tensile strain to channel regions of the NMOS region, annealing to diffuse implanted dopants, and removing the CAPOLY layer.

Figure 3:
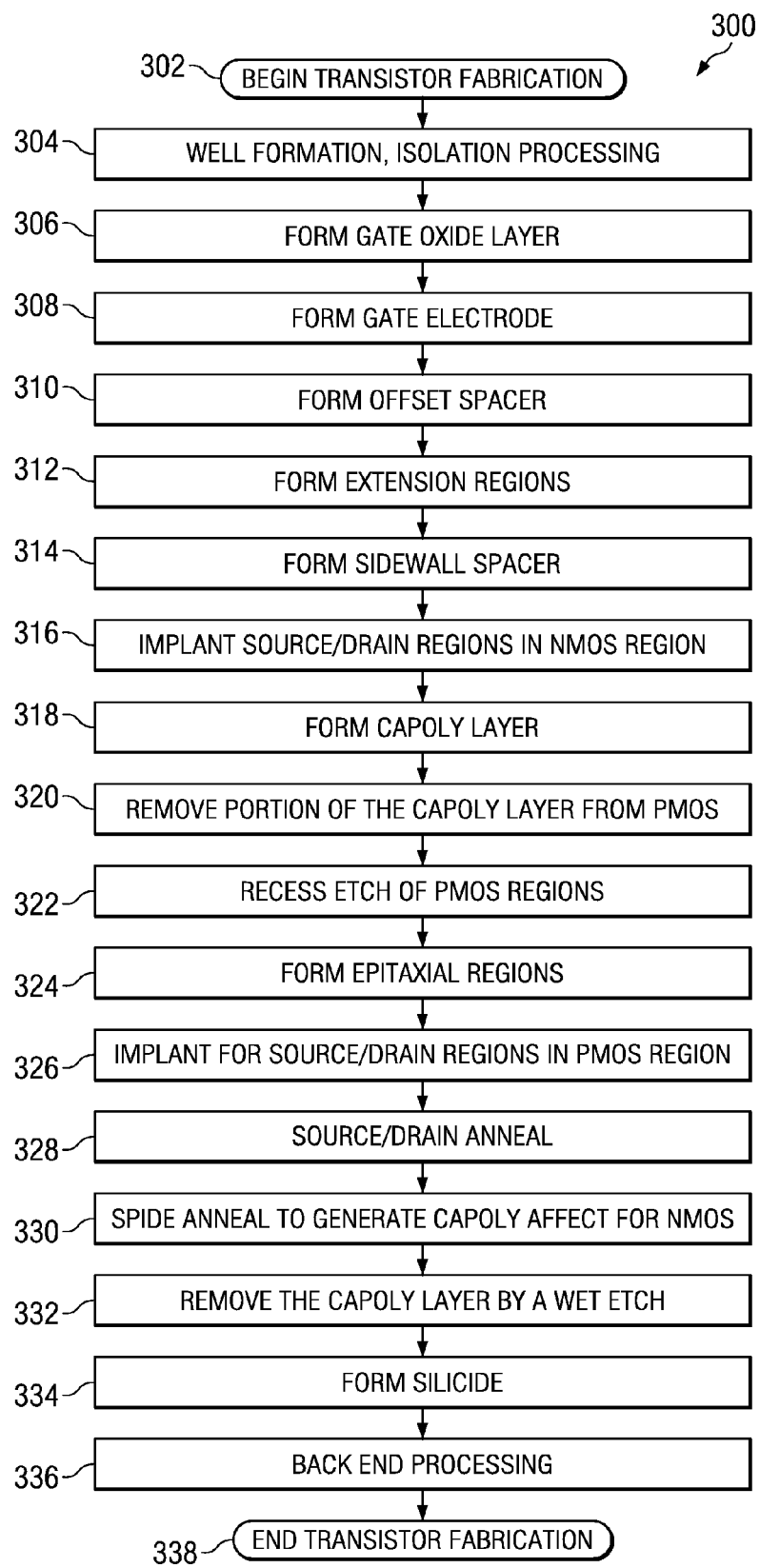
FIG. 3 is a flow diagram illustrating a method of fabricating a semiconductor device wherein types of strain are selectively applied to NMOS and PMOS regions in accordance with an aspect of the present invention.
Figure 4A:
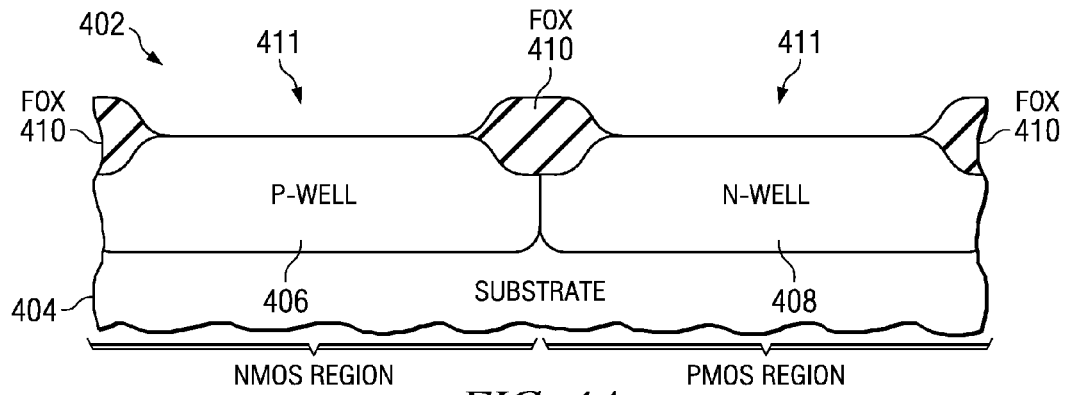
FIGS. 4A–4Q are a plurality of fragmentary cross section diagrams illustrating a transistor device being formed in accordance with an aspect of the present invention.
Figure 4B:
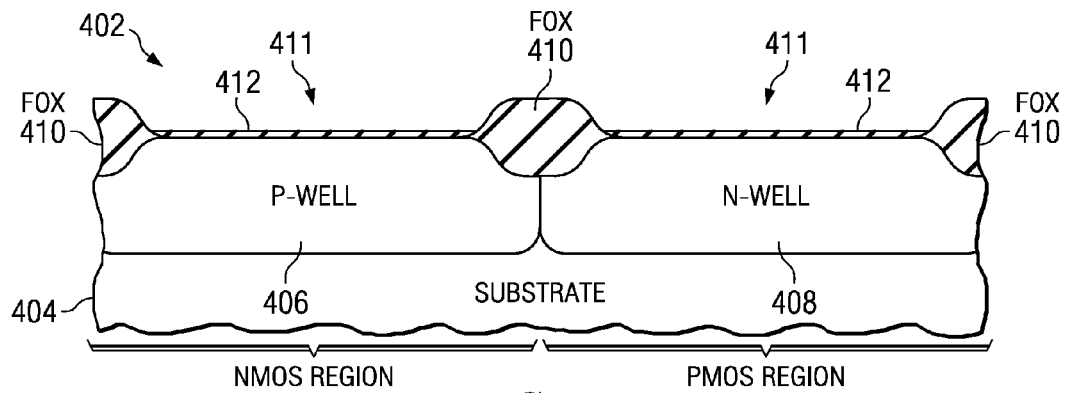
Figure 4C:
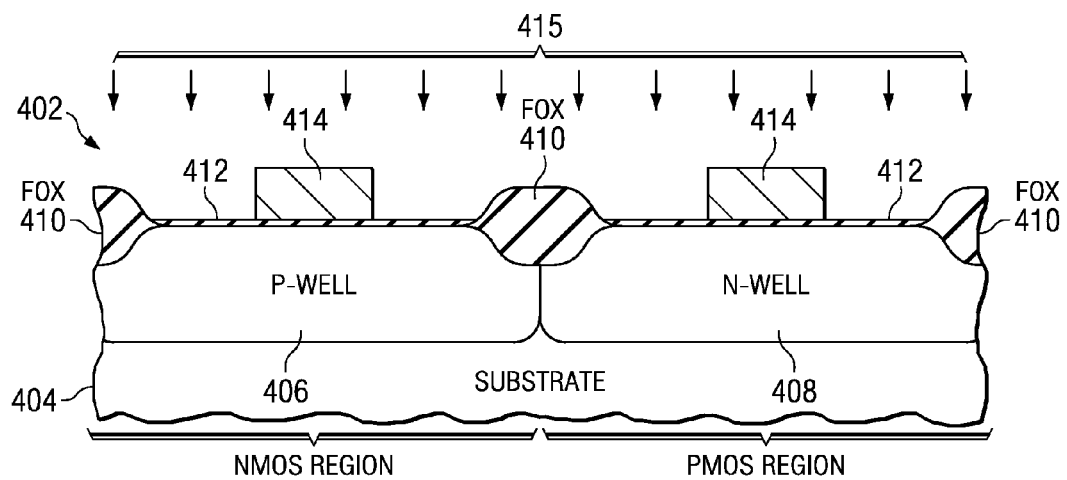
Figure 4D:
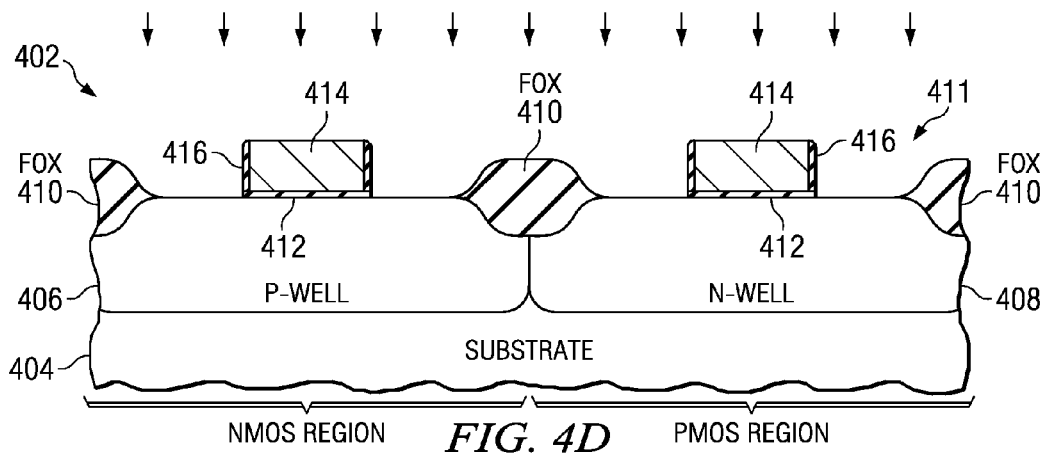
Figure 4E:
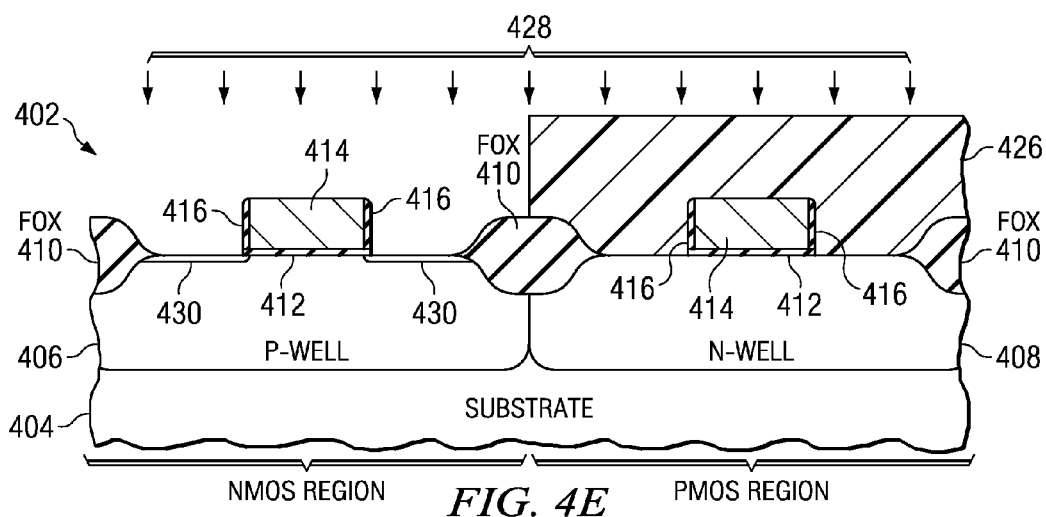
Figure 4F:
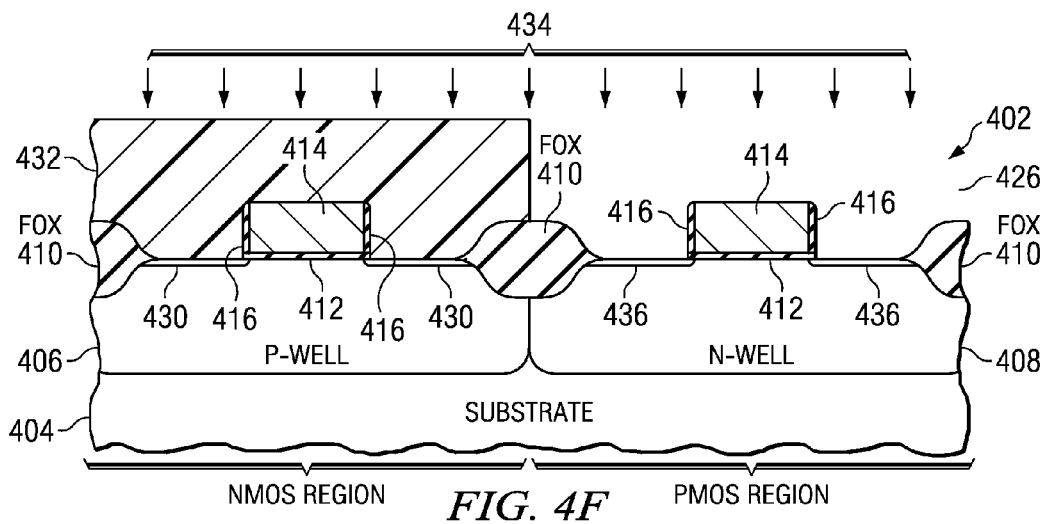
Figure 4G:
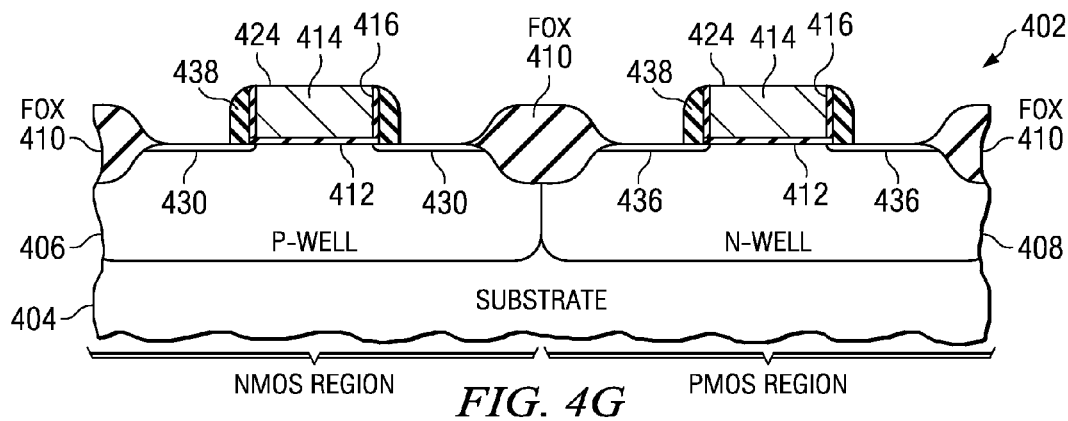
Figure 4H:
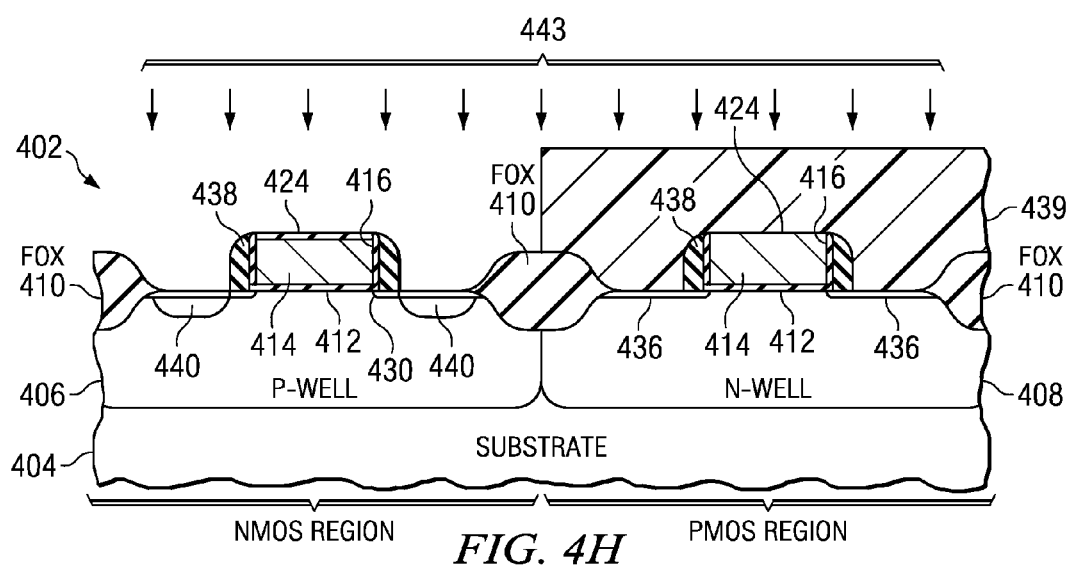
Figure 4I:
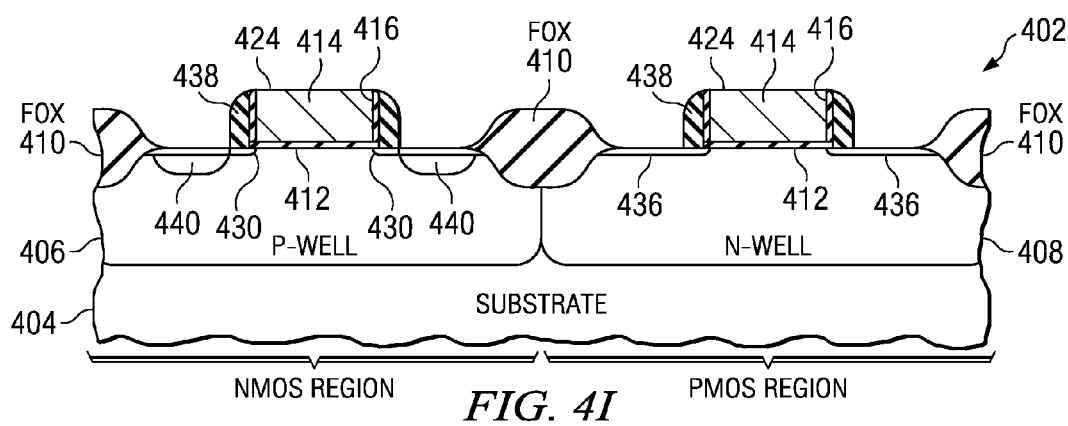
Figure 4J:
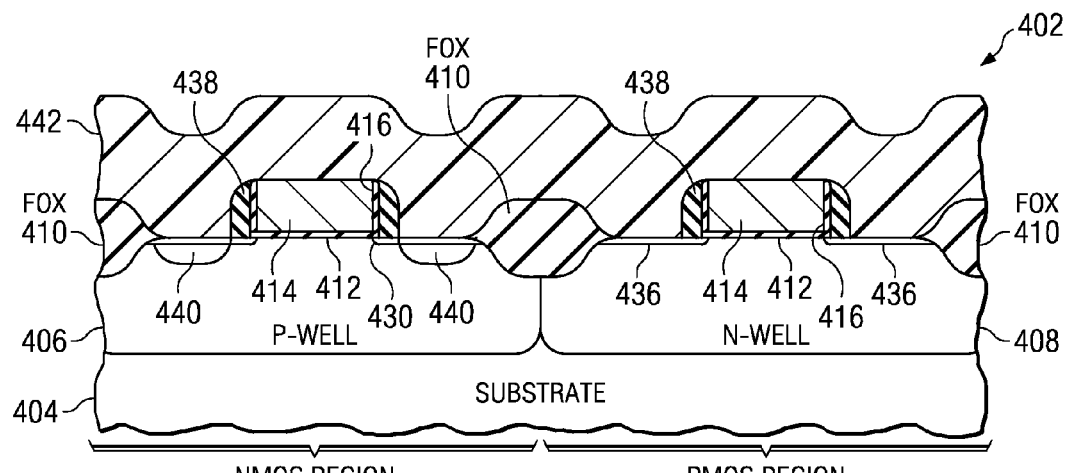
Figure 4K:
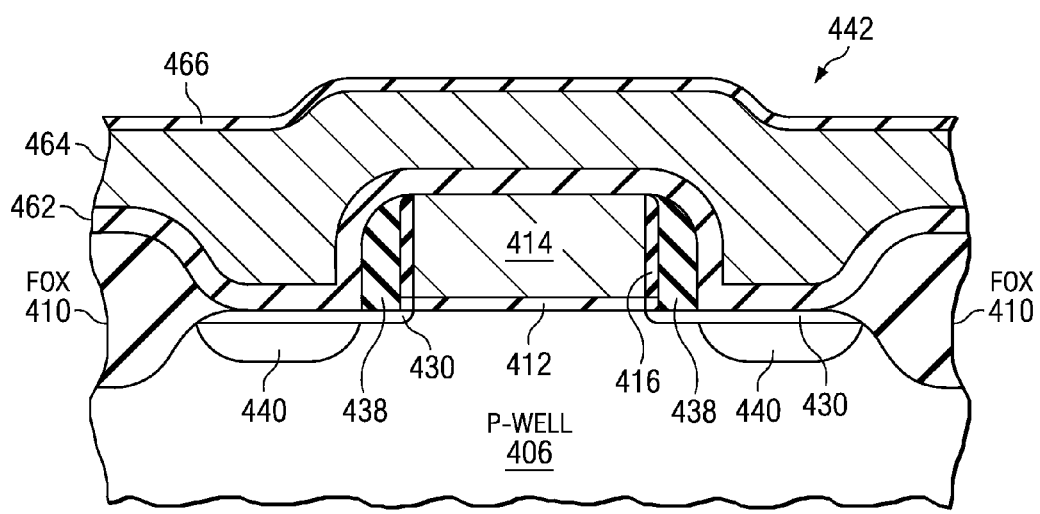
Figure 4L:
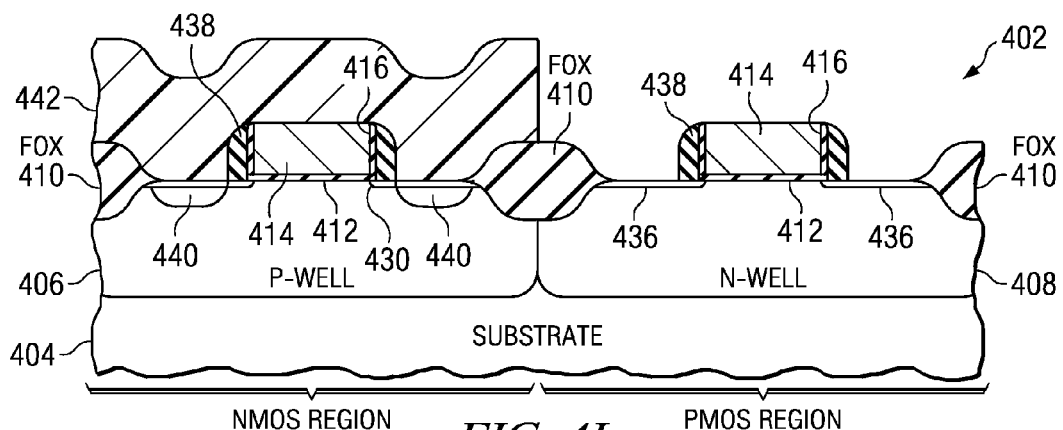
Figure 4M:
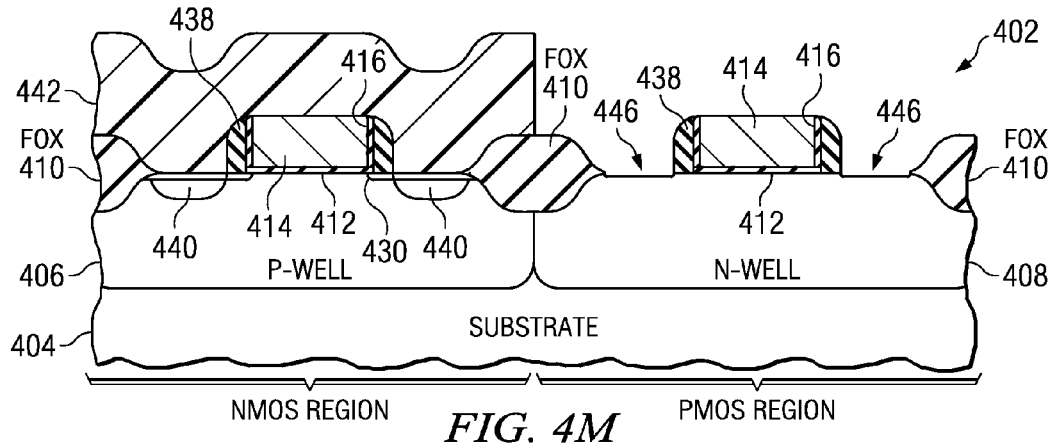
Figure 4N:
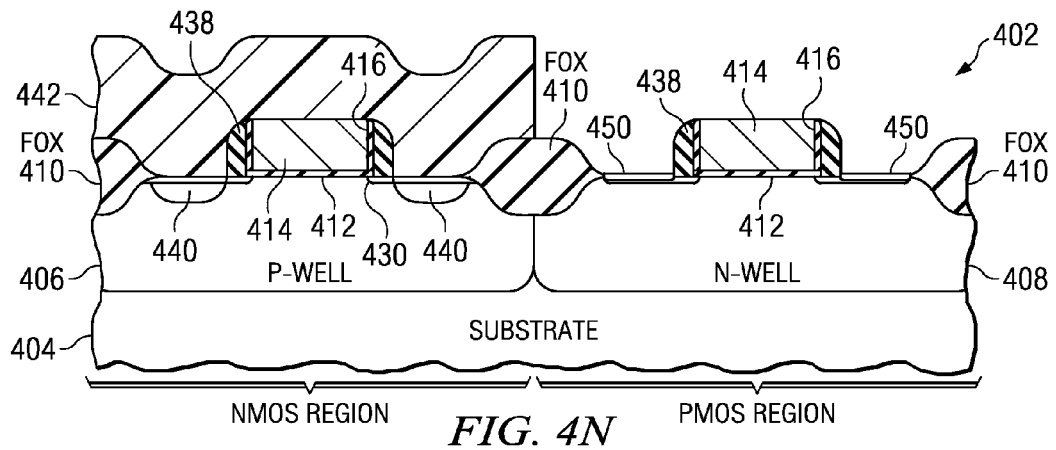
Figure 4O:
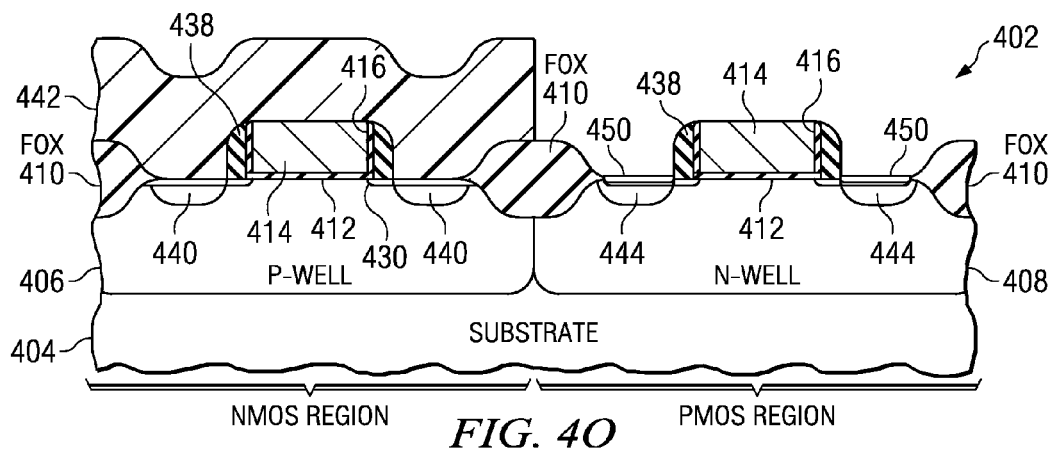
Figure 4P:
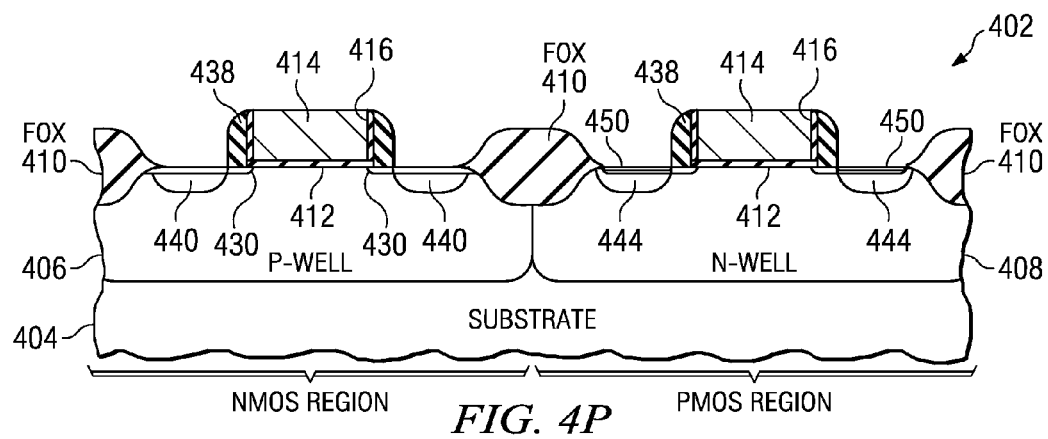
Figure 4Q:
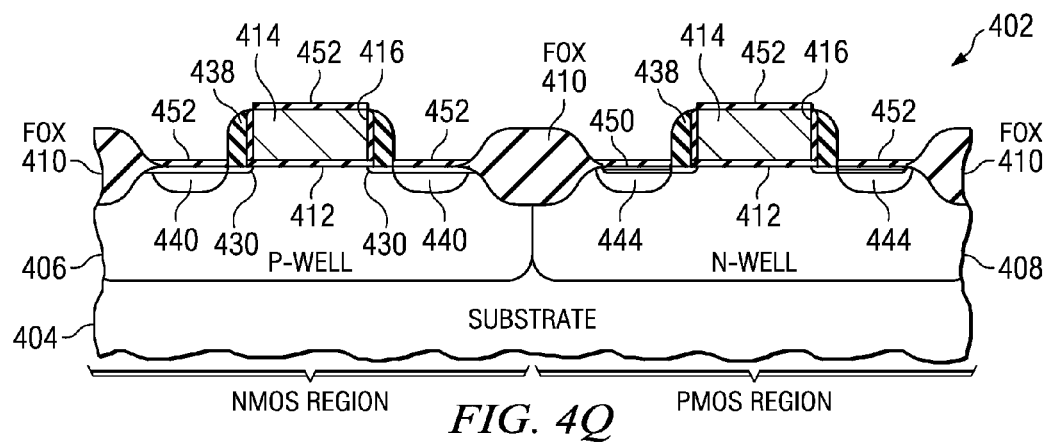

Referring to FIGS. 3 and 4A–4Q, further aspects of the invention relate to methods of fabricating semiconductor devices, wherein FIG. 3 illustrates an exemplary method of fabrication in accordance with the invention, and FIGS. 4A–4Q illustrate the exemplary transistor device at various stages of fabrication in accordance with the invention.

FIG. 3 is a flow diagram illustrating a method 300 of fabricating a semiconductor device wherein types of strain are selectively applied to NMOS and PMOS regions in accordance with an aspect of the present invention. While the exemplary method 300 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the fabrication of ICs and composite transistors illustrated and described herein, as well as in association with other transistors and structures not illustrated, including but not limited to NMOS and/or PMOS composite transistors.

The method 300 begins at 302, wherein transistor fabrication is initiated, and transistor well formation and isolation processing is performed at 304 thereby defining NMOS and PMOS regions, wherein NMOS regions comprise a P-well in which n-type source/drain regions will later be formed, and PMOS regions comprise an N-well in which p-type source/drain regions will later be formed, respectively. In addition, isolation regions may comprise shallow trench isolation (STI) or field oxide regions (LOCOS) that serve to define various active areas and electrically isolate various active areas laterally from one another.

The method 300 continues at 306, wherein a gate oxide layer is formed in active areas defined by the various formed isolation regions. In one example, the gate oxide comprises a thin, thermally grown silicon dioxide layer, however, other type gate dielectrics (such as high-k dielectrics) may be formed and are contemplated by the present invention. A conductive gate layer is then deposited over the gate oxide at 308 and patterned to form a conductive gate electrode. For example, a polysilicon layer may be deposited via chemical vapor deposition (CVD) and patterned via etching to form gate electrodes in both NMOS and PMOS regions, respectively.

An offset spacer is then formed on lateral edges of the conductive gate electrodes at 310. For example, a thin offset layer (e.g., an oxide or nitride layer) is formed generally conformally over the patterned gate and then etched using a generally anisotropic dry etch to remove offset layer material on top of the gate and in the source/drain regions, leaving a thin offset spacer material on lateral edges of the gate.

An extension region implant is then performed at 312 to form extension regions, wherein dopants are introduced in active regions of the device. For example, lightly doped, medium doped or heavily doped extension region implants are performed in the NMOS and PMOS regions, respectively, wherein the gate structure serves to self-align the extension regions. A thermal process such as a rapid thermal anneal can then be employed to activate the extension region dopants, which causes the extension regions to diffuse laterally slightly underneath the offset spacer toward the channels.

Still referring to FIG. 3, sidewall spacers are then formed on the gate structures at 314. The sidewall spacers comprise an insulating material such as an oxide, a nitride or a combination of such layers. The spacers are formed by depositing a layer of such spacer material(s) over the device in a generally conformal manner, followed by an anisotropic etch thereof, thereby removing such spacer material from the top of the gate structure and from the moat or active area and leaving a region on the lateral edges of the gate structure, overlying the offset spacers. The sidewall spacers are substantially thicker than the offset spacers, thereby resulting in the subsequently formed source/drain regions to be offset from lateral edges of the gate.

Source/drain regions are then formed in the NMOS region by masking the PMOS region, exposing the NMOS region, and implanting n-type dopants (e.g., arsenic and/or phosphorous) at 316. The source/drain dopant is introduced into the exposed areas (top of gate electrode and active areas not covered by the sidewall spacers).

A CAPOLY layer is formed over the device at 318 by, for example, depositing a lower oxide layer, a nitride layer, and a top oxide layer. The lower oxide layer has a suitable thickness such as, for example, about 30 to 300 Angstroms, which serves as an etch stop layer and protects underlying portions of the semiconductor device. The nitride layer is formed on the lower oxide layer and has a suitable thickness such as, for example, about 300 to about 900 Angstroms selected to provide a desired amount of uniaxial or biaxial tensile strain in channel regions of devices within the NMOS region. This desired amount of strain is also referred to the CAPOLY effect. The top oxide layer is formed on the nitride layer and serves to facilitate patterning of the CAPOLY layer by permitting photoresist to more easily adhere to the CAPOLY layer. Typically, the top oxide layer is about 10 to 30 Angstroms thick.

A portion of the CAPOLY layer is removed at 320 from the PMOS region by employing a dry etch process to remove the nitride layer within the PMOS region. A resist mask can be employed to prevent the CAPOLY layer from being removed in the NMOS region. The dry etch process is selective to oxide, but can etch through the thin top layer. The lower oxide layer operates as an etch stop for the dry etch process in the PMOS region. It is appreciated that at least a portion of the lower oxide layer remains in the PMOS region after the nitride etch.

A recess etch is then performed in PMOS region to remove a selected amount of semiconductor material from the exposed active regions at 322. The etched area refers to the active region of the silicon body where extension regions and source/drain regions may be formed. The recess is formed using, for example, a dry etching process such as the chemistry employed to etch STI trenches in the semiconductor body when forming isolation regions. The recesses, in one example extend into the semiconductor body to a depth of about 10 nm to about 90 nm.

An epitaxial formation process is employed to form epitaxial regions (e.g., silicon-germanium) at 324 in recessed portions of the PMOS region. The epitaxial formation process utilizes bottom surfaces of the recessed active regions as a seed for the growth process, such as, chemical vapor deposition (CVD) and/or molecular beam epitaxy (MBE), and the like. The formed epitaxial regions are typically thicker than the recessed portions in order to mitigate damage from later removal of the CAPOLY layer from the NMOS region and can be selectively doped during and/or after formation of the epitaxial regions. The CAPOLY layer prevents epitaxial regions from forming in the NMOS region. Additionally, it is appreciated that a pre epitaxial clean is typically performed prior to the epitaxial growth in order to remove any undesired residue from the recessed portions of the PMOS region. The amount of recess etch, the thickness of the epitaxial regions, and composition of the epitaxial regions are selected according to a desired amount of compressive stress to introduce on channel regions of transistor devices within the PMOS region. The introduced compressive stress can be biaxial or uniaxial and typically improves performance of PMOS transistor devices within the PMOS region.

Continuing with the method 300, source/drain implants are performed in the PMOS region by employing the CAPOLY layer as a mask and implanting p-type dopants (e.g., boron) at 326. The source/drain dopant is introduced into the exposed areas (top of gate electrode and active areas not covered by sidewall spacers). A first anneal is performed at 328 to form source/drain regions by causing implanted dopants to diffuse. It is appreciated that the formed epitaxial regions can be doped in situ. As a result, the source/drain implants performed at 326 can be avoided in alternate variations of the method 300 in accordance with the present invention.

A spike anneal is performed at 330 for a relatively short time and high temperature in order to produce the CAPOLY effect, described above. The time and temperature employed in the spike anneal are selected according to characteristics of the transistors being formed. Furthermore, the CAPOLY layer is only present within the NMOS region. Accordingly, uniaxial or biaxial tensile strain resulting from the CAPOLY layer is introduced to channel regions of the NMOS devices and not channel regions of the PMOS devices. Thus, channel mobility (electron mobility) is improved in the NMOS regions and degradation of channel mobility is mitigated because the CAPOLY layer is not present over the PMOS region.

The CAPOLY layer is removed at 332 by, for example, employing a wet etch process. A suitable composition for the wet etch process is phosphoric acid. The epitaxial regions may be etched slightly by the wet etch process, however their extra thickness mitigates degradation of device performance for the PMOS devices.

The method 300 then concludes with silicide processing at 334, wherein a refractory metal material is formed over the device, followed by a thermal process, wherein the metal and silicon interfaces react to form a silicide (on top of the gate and in the source/drain regions). Unreacted metal is then stripped away, and back end processing such as interlayer dielectric and metallization layers are formed at 336 to conclude the device formation at 338.

Turning now to FIGS. 4A–4Q, a plurality of fragmentary cross section diagrams illustrating a transistor device being formed in accordance with the present invention of the method 300 of FIG. 3 is provided. In FIG. 4A, a transistor device 402 is provided, wherein a semiconductor body 404, such as a semiconductor substrate, has a number of wells formed therein, such as a P-well 406 to define an NMOS transistor device region and an N-well 408 to define a PMOS transistor device region, respectively. Further, isolation regions 410 such as STI regions are formed in the semiconductor body to define active area regions 411, as may be appreciated. In FIG. 4B, the transistor device 402 is illustrated, wherein a gate oxide 412 has been formed, for example, by thermally grown $SiO_2$, over the active areas 411.

Referring to FIG. 4C, a conductive gate electrode material (e.g., polysilicon) has been deposited and patterned via an etching process 415 to form a gate electrode 414 overlying the gate oxide 412. Turning now to FIG. 4D, offset spacers 416 are then formed on the lateral edges of the gate electrode.

The PMOS region is then masked off, as illustrated in FIG. 4E with a masking material 426 such as photoresist, and an extension region implant 428 is performed to form n-type extension regions 430 in the NMOS region.

The n-type extension region mask 426 is then removed, and a p-type extension region mask 432 is deposited and patterned to cover the NMOS region, as illustrated in FIG. 4F. A p-type extension region implant process 434 is then performed to form p-type extension regions 436 in the PMOS region, as illustrated. The mask 432 is then removed and a thermal process such as a rapid thermal anneal can be performed to activate the dopants, wherein a lateral diffusion of the extension regions 430 under the offset spacers 416 can be achieved.

Sidewall spacers are then formed over the offset spacers 416 on the lateral edges of the gate structures. An insulating sidewall material is deposited in a generally conformal manner over the device and subsequently subjected to an anisotropic etch to remove the insulating material on top of the gate and over the active areas, leaving sidewall spacers 438 in both the NMOS and PMOS regions, as illustrated in FIG. 4G.

Source and drain regions 440 are formed in the NMOS region. As discussed above in conjunction with the extension region implants, the source/drain implants 443 are performed with an NSD mask 439 to implant the NMOS region with an n-type dopant. It is appreciated that variations of these masks can be employed in the present invention to implant n-type dopants. As can be seen in FIG. 4H, the source/drain regions 440 are self-aligned with respect to the sidewall spacers, and thus are laterally spaced from the extension regions 430. FIG. 4I illustrates the device after removal of the NSD mask 439 and also illustrates that the source/drain regions 440 are formed in the NMOS region, but source/drain regions are not yet formed in the PMOS region.

A CAPOLY layer 442 is formed over the device in both the NMOS and PMOS regions as illustrated in FIG. 4J. The CAPOLY layer 442 is formed by depositing or growing a lower oxide layer 462, a nitride layer 464, and a top oxide layer 466. FIG. 4K is a close up view of the device and further illustrates the CAPOLY layer 442. The nitride layer 464 is shown formed on the lower oxide layer 462. The top oxide layer 466 is formed on the nitride layer 464.

The lower oxide layer 462 has a suitable thickness, for example of about 30 to 300 Angstroms. The lower oxide layer 462 serves as an etch stop layer and protects underlying portions of the device. The nitride layer 464 is formed on the lower oxide layer 462 and has a suitable thickness, for example, about 300 to 900 Angstroms. The thickness of the nitride layer 464 is selected according to a desired amount of tensile strain to be applied to channel regions of NMOS devices within the NMOS region. This strain is also referred to as the CAPOLY effect. The top oxide layer 466 is formed on the nitride layer 464 and is facilitates patterning of the CAPOLY layer 442 by allowing photoresist to more easily adhere to the CAPOLY layer 442. The top oxide layer 466 is thick enough to facilitate the adherence of the photoresist to the top oxide layer 426, such as, about 10 to 30 Angstroms.

A portion of the CAPOLY layer 442 is removed from the PMOS region by a dry etch process that removes a portion of the nitride layer 464 from the PMOS region. A portion of the top oxide layer 466 is also removed from the PMOS region by the dry etch process. The dry etch process is selective to oxide, however the top oxide layer 466 is thin enough to permit the dry etch process to remove it from the PMOS region. FIG. 4L depicts the device with the portion of the CAPOLY layer 442 removed from the PMOS region.

Recessed regions 446 are then formed in the active areas of the PMOS region using an etch process, wherein the gate electrode 414, isolations areas 410, and the CAPOLY layer 442 serve as a mask. The etch process typically comprises a dry etching process such as the chemistry employed in forming STI trenches when forming isolation regions. The recessed regions 446, in one example, extend into the semiconductor body to a depth of about 30 nm to about 90 nm. FIG. 4M illustrates the recessed regions 446 formed by the recess etch process.

Turning now to FIG. 4N, epitaxial regions 450 (e.g., comprised of SiGe) are shown formed in place of the recessed regions 446. The epitaxial regions 450 are typically thicker than the recessed regions 446 so that later wet etch processes do not disturb underlying portions of the active regions. The CAPOLY layer 442 prevents epitaxial regions from forming in the NMOS region. The thickness of the epitaxial regions 450 and the recessed regions 446 are selected according to a desired amount of compressive strain to be introduced on channel regions of transistor devices within the PMOS region.

Turning to FIG. 4O, source/drain regions 444 are formed in the PMOS region by employing the CAPOLY layer 442 as a mask and implanting p-type dopants (e.g., boron). A spike anneal, which operates for a relatively short time and high temperature, induces the CAPOLY effect that introduces tensile strain on NMOS devices within the NMOS region as a result of the anneal and the presence of the CAPOLY layer 442. The source/drain regions 444 are further formed by the spike anneal that causes the implanted dopants to diffuse and the damaged silicon to heal. It is appreciated that the epitaxial regions can be doped during formation thereby avoiding subsequently implanting p-type dopants.

The CAPOLY layer 442 is removed by a wet etch process, such as one employing phosphoric acid. FIG. 4P serves to illustrate the device after removal of the CAPOLY layer 442. A dry etch, selective to oxide, can be employed to remove nitride material from the CAPOLY layer 442. It is appreciated that other types of etching can be performed to remove the CAPOLY layer 442 in accordance with the present invention.

Continuing, silicide regions 452 are formed on active regions and gate electrodes 414 by a suitable silicidation process. FIG. 4Q depicts the semiconductor device after formation of the silicide regions. Typically, silicide regions are formed by depositing a refractory metal (e.g., nickel, cobalt, titanium, alloys thereof, and the like) over the device and inducing (e.g., by annealing) the deposited refractory metal to react with underlying silicon forming silicide regions that reduce contact resistance between active regions and electrodes with contacts, interconnects, and the like. Unreacted refractory metal is then removed. Subsequently, back end processing including metallization may be performed to interconnect the various transistors, as may be desired.

While, for purposes of simplicity of explanation, the methodologies of FIGS. 1, 2 and 3 are depicted and described as executing serially, it is to be understood and appreciated that the present invention is not limited by the illustrated order, as some aspects could, in accordance with the present invention, occur in different orders and/or concurrently with other aspects from that depicted and described herein. Moreover, not all illustrated features may be required to implement a methodology in accordance with an aspect the present invention.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method of fabricating a semiconductor device comprising:
    forming a CAPOLY layer over an NMOS region of the semiconductor device;
    performing a recess etch on active regions in a PMOS region of the semiconductor device that forms recessed regions, wherein the CAPOLY layer prevents etching of active regions in the NMOS region;
    performing an epitaxial formation process in the recessed regions that introduce a first type of strain across channel regions in the PMOS region; and
    annealing the device causing the CAPOLY layer to introduce a second type of strain across channel regions in the NMOS region.

2. The method of claim 1, further comprising removing the CAPOLY layer.

3. The method of claim 1, further comprising forming well regions and isolation regions in a semiconductor substrate of the PMOS and NMOS regions.

4. The method of claim 3, further comprising forming extension regions in the PMOS and NMOS regions prior to forming the CAPOLY layer.

5. The method of claim 4, further comprising forming active regions in the NMOS region prior to formation of the CAPOLY layer by implanting n-type dopants.

6. The method of claim 5, further comprising forming active regions in the PMOS region subsequent to formation of the CAPOLY layer.

7. The method of claim 6, wherein the active regions in the PMOS region are formed prior to performing the recess etch.

8. The method of claim 1, wherein the CAPOLY layer is formed by depositing a lower oxide layer over the device, depositing a nitride layer on the lower oxide layer, and depositing a top oxide layer on the nitride layer.

9. The method of claim 8, wherein the nitride layer is deposited to a thickness selected according to a desired amount of the second type of strain.

10. The method of claim 9, wherein the selected thickness is about 80 nm.

11. The method of claim 1, wherein the recess etch is performed to form recessed regions having a thickness selected according to a desired amount of the first type of strain.

12. The method of claim 1, wherein the epitaxial formation process is performed to form epitaxial regions having a thickness selected according to a desired amount of the first type of strain.

13. The method of claim 1, wherein the first type of strain is compressive and the second type of strain is tensile.

14. The method of claim 1, wherein the first type of strain is tensile and the second type of strain is compressive.

15. A method of fabricating a semiconductor device comprising:
- performing well formation and isolation processing in a semiconductor body;
- forming a gate oxide layer on the semiconductor body;
- forming gate electrodes on the gate oxide layer;
- forming offset spacers on lateral edges of the gate electrodes;
- forming extension regions in the semiconductor body in NMOS and PMOS regions;
- forming sidewall spacers adjacent the offset spacers;
- implanting source/drain regions in the NMOS region;
- forming a CAPOLY layer over the device;
- removing a portion of the CAPOLY layer from the PMOS region;
- performing a recess etch to remove a selected amount from active regions in the PMOS region employing the CAPOLY layer as a mask; and
- performing an epitaxial formation process to form epitaxial regions in the PMOS regions employing the CAPOLY layer as a mask, wherein the epitaxial regions introduce compressive strain to channel regions within the PMOS region; and
- performing an anneal after forming the epitaxial regions in the PMOS region to diffuse dopants present in the epitaxial regions and form source/drain regions in the PMOS region.

16. The method of claim 15, further comprising performing a spike anneal to induce tensile strain to channel regions within the NMOS region.

17. The method of claim 15, further comprising removing the CAPOLY layer via a wet etch process.

18. The method of claim 15, further comprising forming silicide regions on the source/drain regions and gate electrodes in the PMOS and NMOS regions.

19. A method of fabricating a semiconductor device comprising:
- forming a lower oxide layer over NMOS and PMOS regions of the semiconductor device;
- forming a nitride layer on the lower oxide layer;
- forming a top oxide layer on the nitride layer;
- removing a portion of the top oxide layer and a portion of the nitride layer from the PMOS region;
- performing a recess etch in active regions of the PMOS regions employing the lower oxide layer, the nitride layer, and the top oxide layer as a mask; and
- performing an epitaxial formation process in the active regions of the PMOS regions employing the lower oxide layer, the nitride layer, and the top oxide layer as a mask.

20. The method of claim 19, further comprising performing an anneal to introduce tensile strain to channel regions of devices within the NMOS region.

21. The method of claim 19, wherein the amount of recessed material removed and thickness of the epitaxial regions is selected according to a desired amount of compressive stress introduced to channel regions of the PMOS region.

* * * * *